United States Patent [19]

Feldberg

[11] 3,725,842

[45] Apr. 3, 1973

[54] CONNECTOR FOR INTEGRATED PACKAGE

[75] Inventor: Leonard H. Feldberg, Spring Valley, N.Y.

[73] Assignee: Burndy Corporation

[22] Filed: Oct. 16, 1970

[21] Appl. No.: 81,435

[52] U.S. Cl. .......339/17 CF, 317/101 CP, 339/64 M, 339/75 MP, 339/95 D, 339/126 R, 339/174, 339/192 R

[51] Int. Cl. ....................H05k 1/02

[58] Field of Search......339/17 CF, 17 F, 17 L, 17 R, 339/17 LM, 64, 75 MP, 74, 176 M, 176 MP, 176 MF, 192, 174, 193 P, 193 R, 193 S, 194, 95, 97, 99, 126, 128, 125, 91, 64; 317/101 C, 101 CC, 101 CP, 101 D

[56] References Cited

UNITED STATES PATENTS

| | | | |
|---|---|---|---|
| 3,393,396 | 7/1968 | Majewski | 339/220 X |
| 2,951,226 | 8/1960 | Gittens | 339/193 P X |
| 3,409,861 | 11/1968 | Barnes et al. | 339/17 CF X |
| 2,882,514 | 4/1959 | Krantz | 339/17 C X |
| 1,980,214 | 11/1934 | Lum | 339/193 S |
| 3,293,590 | 12/1966 | Woolsey, Jr. | 339/192 R |
| 3,038,117 | 6/1962 | Blain | 339/176 M X |

*Primary Examiner*—Marvin A. Champion
*Assistant Examiner*—Terrell P. Lewis
*Attorney*—Howard S. Reiter

[57] ABSTRACT

A connector is adapted to hold an integrated circuit package in assembled relation thereto and also to a plate or printed circuit board. The connector has electrodes to the ends of which are applied terminals of the integrated circuit package, the electrodes yielding to compensate for variations in the dimensions of the electrodes and terminals. Detent means may be formed on the connector to secure it to the plate or printed circuit board in position to grasp and hold the integrated circuit package.

16 Claims, 7 Drawing Figures

INVENTOR.
Leonard Feldberg
BY Howard S Rute
ATTORNEY.

INVENTOR.
Leonard Feldberg
BY Howard S Reiter
ATTORNEY.

CONNECTOR FOR INTEGRATED PACKAGE

BACKGROUND OF THE INVENTION

1. Field of the Invention

This invention relates to means for securing an integrated circuit package to a plate or the like. More particularly, the invention relates to a connector that will facilitate the assembly of an integrated package, such as a dual inline package, to a plate or printed circuit board. The invention is especially adapted for use with a dual inline package of the standard type having a series of laterally extending terminals to which connection must be made in order to utilize the dual inline package in a circuit.

2. Description of the Prior Art

So far as is known, dual inline packages are today assembled to a plate or printed circuit board by utilizing the terminals of the package as the means of assembly. Thus, the terminals, which generally extend laterally from the package and then at right angles downwardly from the package, are entered into openings of a plate or printed circuit board. By providing shoulders on the downwardly extending portions of the terminals, the movement of the terminals inwardly into the openings of the plate or board is limited, with parts of the terminals extending through the plate or board. By soldering these extending portions of the terminals to suitable electrodes, the inline package is assembled to the plate or board.

It has been proposed also that inline packages be placed directly against a plate, such as one formed of metal, whereby the metal may function as a heat conductor to protect the integrated circuit from heat generated thereby. The upwardly extending terminals of the inline package are then suitably assembled through soldering to wires or the like, as will be appreciated by those skilled in the art. It will be noted that in the constructions set forth, no connector is utilized.

SUMMARY OF THE INVENTION

An important feature of this invention resides in the contribution of a connector that is particularly adapted to have assembled thereto an integrated circuit such as that embodied in a dual inline package. More particularly, the connector is adapted for assembly simultaneously to a plate, such as a printed circuit board, and also to a dual inline package, preferably through the simple application of the connector to the plate and the package.

A further feature of the invention resides in the assembly of the inline package to the connector, with the terminals of the inline package pressed against electrodes of the connector. This simple concept makes it possible to utilize a connector as an intermediary for simplifying the assembly of the inline package both mechanically and electrically to the plate or printed circuit board and to the circuits associated therewith, naturally without resorting to solder.

As a very important and particular feature of the invention, the electrodes of the connector are so formed that they will readily yield to compensate for any inequaltities in the dimensions of the electrodes and in the positioning of the laterally extending terminals of the inline package. As a more particular feature of the invention, the laterally extending terminals are engaged by the electrodes very closely to the body of the inline package, so as not to stress the connection between the terminals and the inline package through pressure exerted between the terminals and the electrodes. Further, the mounting of the electrodes for vertical adjustment under predetermined pressure conditions, allows the application of sufficient pressure to develop a good electrical connection between the electrodes and terminals, while not overly stressing either the electrodes or the terminals.

A still further feature of the invention resides in utilizing the electrodes of the connector for application to parts of the circuit of a printed circuit board through the mere assembly of the connector body to a printed circuit board. Also, the very same electrodes are used for making electrical connection with the terminals of the integrated package that is assembled to the printed circuit board and the connector. As a more particular feature of the invention, simple detent means are utilized for bringing about, without tools or other means, the simultaneous assembly of the connector to the printed circuit board, the circuit of the board to the electrodes of the connector, and the assembly of the inline package terminals to the connector and therefore to the printed circuit.

It may therefor be said that the general object of this invention is to provide for the simple and effective assembly of an integrated circuit such as that of a dual inline package, to a printed circuit board or plate, preferably without solder, and preferably without the utilization of complex assembly means. A more particular object of the invention, is the ingenious application of the connector principle to a dual inline package and a printed circuit board.

BRIEF DESCRIPTION OF THE DRAWINGS

The novel features which are believed to be characteristic of this invention are set forth with particularity in the appended claims. The invention itself, however, both as to its organization and method of operation and concept, may best be understood with reference to the following description taken in connection with the accompanying drawings, in which:

FIG. 5 is a section taken along line 5—5 of FIG. 6, while

DESCRIPTION OF THE PREFERRED EMBODIMENTS

Figures 1, 2:
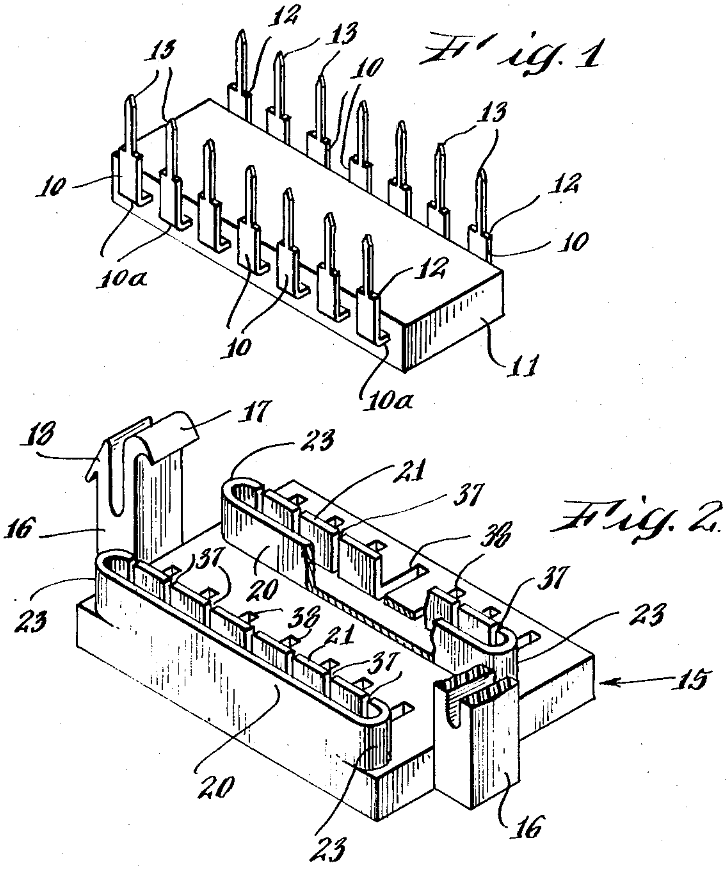
FIG. 1 is a view in isometric of a typical integrated circuit package known commercially as a dual inline package.
FIG. 2 is a view in isometric of a connector constructed in accordance with the concept of this invention, parts of the connector being cut away in order to illustrate its construction.

Referring now more particularly to the drawings, the standard dual inline package shown in isometric in FIG. 1 embodies a series of terminals, each designated by reference numeral 10, and extending laterally from a package body 11. As will be noted, the terminals are shouldered at 12, so that they may be applied to a printed circuit board with the shoulders 12 limiting the movement of the terminals into openings in the board, so that the ends 13 of the terminals can then be soldered, as may be required, either to wires or to parts of the printed circuit carried by the board. The invention of this application, as already set forth generally, embodies means for effectively assembling the package of FIG. 1 to a plate or printed circuit board, without solder, and through utilization of a novel connector.

The connector body forming a part of the invention of this application is well shown in FIG. 2, where it is designated generally by reference numeral 15. Upstanding from each end of the connector 15 is a post 16, and this post is divided preferably into a pair of separate detent portions 17 and 18. It will be noted that the post 16 at the right hand end of the body 15 has been cut away in order to permit a better showing of the remainder of the connector body. It will be appreciated that the connector body may be made in long strips, and that intermediate posts 16 may take a relatively narrow form so as to include only one of the detent portions, such as the detent portion 17, all as will be made clear presently.

The connector body 15 is formed of a suitable insulating plastic material, and is adapted generally to hold electrodes for all of the terminals 10 of package 11. A walled space is defined and outlined at each side of the upper surface of body 15 by spaced wall portions 20 and 21 connected by rounded ends 23. Obviously, each of the pairs of walls 20, 21 and the rounded ends 23, define an insulating walled space, and it is within these walled spaces that the ends of the electrodes of the connector 15 are adapted to lie, as will be set forth presently.

The connector body 15 is adapted to house therewithin, and to hold assembled relatively thereto, a series of electrodes equal generally in number to the number of terminals 10 of the dual inline package 11. One of the electrodes is well shown in isometric in FIG. 3. There, it will be noted that the electrode, bearing reference numeral 25, has a first vertical portion 26 formed with a sharpened end 27, on which is formed a laterally extending barrier 28. The electrode 25 has a second portion designated by reference numeral 29 formed with a retaining lug 30. Extending between the portion 26 of the electrode 25 and the portion 29, is a lateral portion 31 that may be considered as connecting the two laterally offset vertical portions 26 and 29.

Figures 5, 6, 7:
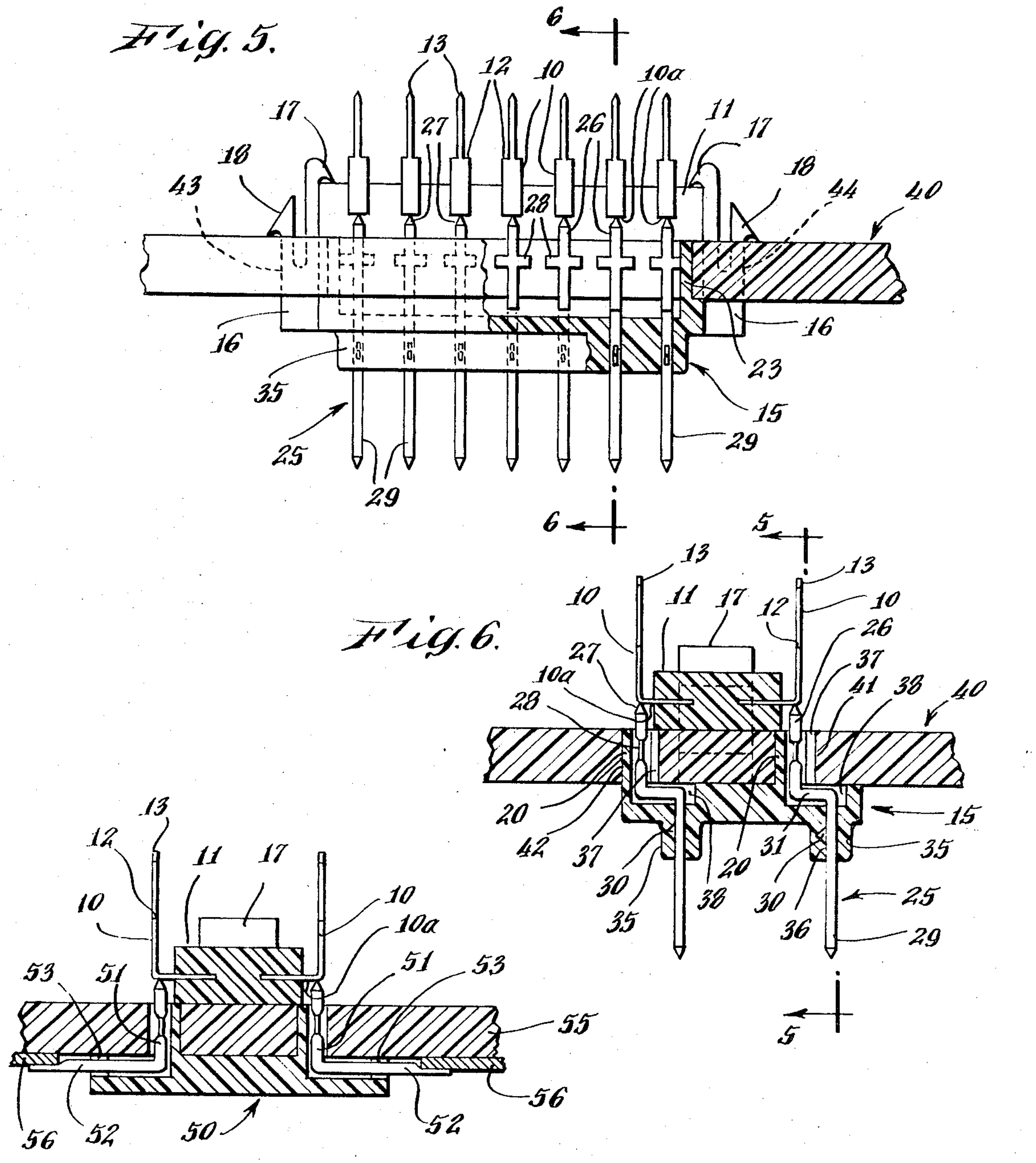
FIG. 5 is a partial sectional view through the plate of FIG. 4 and the connector of FIG. 2, showing the package of FIG. 1 assembled to the connector and the plate. Actually
FIG. 6 is a section taken along line 6—6 of FIG. 5.
FIG. 7 is a section similar to the section shown in FIG. 6, of a modified form of the invention in which the electrodes of the connector extend laterally into engagement with parts of the circuit of a printed circuit board.

The connector body 15, in order to house each of the electrodes 25, is formed with a downwardly extending portion 35 as best seen in FIG. 6, having a bore 36, into which the part 29 of each electrode may be entered. Obviously, the lug 30 of each electrode 25, as well illustrated in FIG. 6, will be forced into the body of the portion 35 of the connector, and will thereafter hold the portion 29 of the electrode against movement from its assembled position in the connector body. In order to allow movement of each electrode 25 into the position of FIG. 6 relatively to the connector body 15, each wall 21 is formed with a series of slots 37 extending into lateral openings 38 of the connector body 15. It is obvious that the slots 37 will permit the downward movement of each of the lateral portions 31 of each electrode 25 into the position of FIG. 6, with each portion 31 lying in a lateral opening 38 of the connector body 15.

It will be noted also that the laterally extending barrier 28 of each electrode 25 will lie within the walled spaced defined by the walls 20, 21 and end walls 23, and will prevent movement of the electrodes portions 26 to the right in FIG. 6 outwardly of the walled space. This will hold the several electrodes 25 within an insulated walled space of the connector 15, as will be well appreciated by those skilled in the art.

Figure 4:
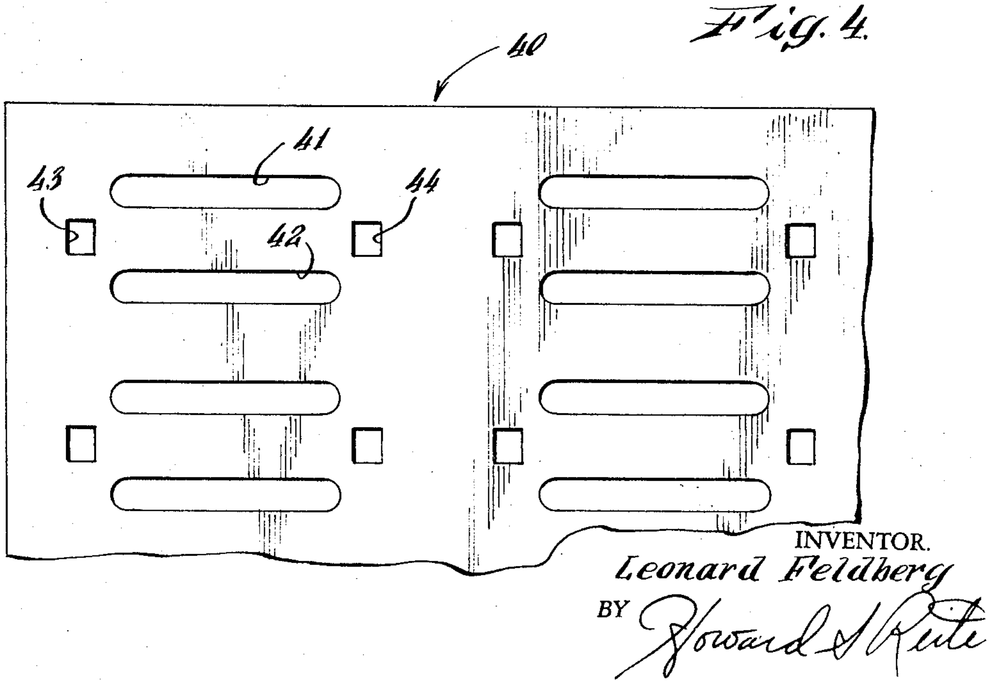
FIG. 4 is a plan view of a plate or printed circuit board adapted for utilizing the connector of this invention.

The connector of the invention, as was earlier outlined, is adapted for utilization with a plate or printed circuit board formed with a series of openings, as well illustrated in FIG. 4. Thus, the plate indicated generally in FIG. 4 by reference numeral 40, will have a series of pairs of related openings 41 and 42. Each pair of openings 41 and 42 will house a pair of upstanding walls 20, 21 of the connector 15 as will be apparent. Associated with each pair of openings 41 and 42 are openings 43 and 44, said openings being adapted for housing the upstanding posts 16 of the connector body 15.

Referring now to FIG. 5, it is obvious that the connector body 15 may be moved into the assembled position there illustrated relatively to plate 40 by the mere passage of the posts 16 upwardly through the openings 43 and 44. It is further obvious that detent portions 18 of the posts 16 will lock relatively to the plate 40, and will securely hold the connector body 15 in position. Only by pressing the detent portions 18 inwardly, as is possible because of the yielding plastic construction thereof, can the connector 15 be unlocked from the plate 40 and removed.

Now, with the connector body 15 assembled to the plate 40 as illustrated in FIG. 5, it is possible to move the dual inline package into the position of FIGS. 5 and 6 relatively to the connector 15, with the body 11 of the dual inline package held against one surface of the plate 40, while the detent portions 17 securely hold the body 11 against movement away from the plate. The movement of the body 11 into the position illustrated in FIG. 5 and FIG. 6 obviously brings an undersurface **10*a* of each terminal 10 against the sharp end portion 27 of each electrode 25. The arrangement of the several parts is such that the detents 17 will hold the body 11 in such position, that the surfaces 10*a* will have predetermined pressure relation to the sharpened ends 27 of the electrodes 25, whereby to make good electrical contact therewith. It is obvious that any variation in the positioning of the surfaces 10a relatively to the body 11 of the dual inline package, and any variations of the lengths of electrodes 25, will be compensated through downward flexing of the portions 26 of each electrode 25 by the downward bending of the laterial portions 31 of the several electrodes 25, as can best be seen in FIG. 6**.

It will also be noted that contact will be made between the surfaces **10*a* and the portions 27 of electrodes 25 near the body 11** of the dual inline package.

Therefore, there will be minimum stress directed to disturb the relationship between the terminals 10 and the dual inline package by the application of pressure to terminals 10 by the ends 27 of electrodes 25. This is also well illustrated in FIG. 6. It will also be noted in FIG. 6 that the portions 29 of the several electrodes 25 are available for contact with wires in any manner that may be desired so as to close particular circuits.

While it is preferred to use detents 18 to assemble the connector body 15 to the plate 40, it will be seen that with the detents 18 eliminated in FIG. 5, the detents 17 will hold the connector body 15 and the inline package body 11 assembled to one another and also to the plate 40. This arrangement may be utilized in some types of assemblies.

Figure 3:
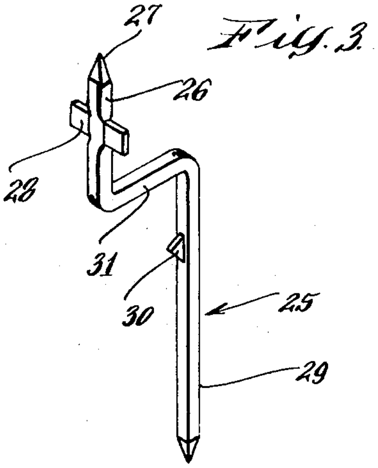
FIG. 3 is a view in isometric of one of the electrodes of the connectior of FIG. 2.

In the modification of FIG. 7, the connector body is designated by reference numeral 50, and each of the electrodes is designated by reference numeral 51. It will be noted that each of the electrodes 51 is formed so that the equivalent of the portion 29 of the electrode 25 of FIG. 3, is eliminated. However, each electrode has a vertical portion exactly like that of the portion 26 of electrode 25 of FIG. 3, and also a lateral portion that functions as does the lateral portion 31 of the electrode of FIG. 3. This lateral portion of each electrode 51 is designated in FIG. 7 by reference numeral 52.

The connector body 50 is formed so that each electrode 51 may be inserted downwardly vertically into a walled space as in the first modification, after which the part 52 of each electrode is held in position by staking of the plastic of body 50 at 53. Obviously, the lateral portion of each electrode 51 between the staking at 53 and its vertical portion equivalent to the part 26 of the electrode 25, will flex as in the first modification and permit yielding of the electrodes 51 for adjustment relatively to the surfaces 10*a* of the terminals 10 of the dual inline package. Instead of a plate 40, there is utilized in FIG. 7 a printed circuit board 55, and parts of the printed circuit itself are there designated by reference numeral 56. The portions 52 of the electrodes 51 are adapted automatically for application to the printed circuits parts 56 when the body of the connector 50 is assembled to the printed circuit board 55. This assembly is effected in the same manner as the assembly of the connector 15 to plate 40 of FIG. 4. In other words, the connector 50 will have a detent 18 for this purpose as well illustrated in FIG. 2. Also, the connector 50 will have detent portions 17 for securing the dual inline package to the connector 50 exactly as the package body 11 is secured to the connector body 15 in FIGS. 5 and 6. Also, detents 18 may be eliminated as noted with regard to the first modification.

While the invention has been described with respect to certain specific embodiments, it will be appreciated that modifications and changes may be made by those skilled in the art without departing from the spirit of the invention and its concept. It is intended therefore, by the appended claims to cover all such modifications and changes as fall within the true spirit and scope of the invention.

What is claimed as new and what is desired to be secured by Letters Patent of the United States is:

1. A connector for a dual inline package or the like of the type having terminals extending laterally therefrom, comprising a connector body relatively to which said package is secured, said connector body having electrodes adapted to make contact with said laterally extending terminals, each of said electrodes having an upper vertical first portion formed with relatively sharp ends against which one of said laterally extending terminals impinges when said package is secured relatively to said connector body, said electrode having a second portion secured to said connector body at a point laterally offset from the first portion, together with an intermediate portion free of said connector body and extending between said first two portions and yielding to permit vertical movement of said first portion as it is pushed downwardly by one of said laterally extending terminals incidental to the securing of said package relatively to said connector body.

2. In the combination of claim 1, the feature that said connector is formed with detent means for grasping and holding said package with its laterally extending terminals pressed against said vertical first portions.

3. In the combination of claim 2, the feature that said detent means are formed to engage and hold said connector and inline package assembled to a plate or the like as well as to one another.

4. In the combination of claim 1, the feature that said connector body is formed with detent means for engaging a plate or the like to assemble said connector body to said plate.

5. In the combination of claim 1, the feature that said connector body is formed of insulating material and has a base adapted to lie with its upper surface against the under surface of a plate, said body having a space outlining wall extending vertically from said base to define a walled space, said plate having an opening for receiving said wall, and said vertical first portions of said electrodes extending vertically within said walled space and insulated from said plate by said wall.

6. In the combination of claim 5, the feature that said second portion extends horizontally outwardly of said base to be pressed against a conductor of a printed circuit applied to the under surface of said plate.

7. In the combination of claim 5, the feature that said connector body has detent means extending also through openings in said plate for securing said package to said connector body.

8. In the combination of claim 1, the feature that said connector body has a base in which the second portion of each electrode is secured, a space outlining wall extending vertically from said base and having a vertical slot, and said vertical first portion lying within the space surrounded by said wall with said intermediate portion extending through said slot toward said second portion.

9. In the combination of claim 8, the feature that said vertical first portions have means thereon contacting said wall to prevent movement of said first portions through said slots outwardly of said walled space.

10. In the combination of claim 1, the feature that said second portion extends horizontally outwardly of said connector body to be applied against a conductor of a printed circuit.

11. In the combination of claim 1, the feature that said second portion extends generally vertically outwardly of said connector body whereby to be accessible for the completion of a circuit through said electrode.

12. A connector for a dual inline package or the like of the type having terminals extending therefrom, comprising a connector body, said connector body having a base to be applied against the underside of a plate, a space outlining wall extending vertically from said base and adapted to enter an opening in said plate as said base is applied to the underside of said plate, a series of electrodes formed with relatively sharp ends extending vertically through said body and upwardly through the space outlined by said wall, detent means secured to said connector body base and also extending through openings in said plate beyond the upper side of said plate, said detent means being formed to hold a dual inline package or the like having terminals extending therefrom in assembled relation to said plate and to said connector body with said terminals pressed against said relatively sharp ends of said electrodes.

13. In a connector, a connector body having a series of electrodes formed with relatively sharp ends adapted to make contact with terminals pressure applied to said sharp ends of said electrodes, each of said electrodes having an upper vertical first portion spaced from said connector body and against which a terminal is pressure applied, said electrode having a second portion secured to said connector body at a point laterally offset from said first portion, together with an intermediate portion free of said connector body and extending between said first two portions and movable yieldingly in a vertical plane to permit vertical yielding movement also of said first portion under the pressure of said terminal.

14. In the combination of claim 13, the feature that said connector body is formed with detent means for holding assembled thereto an electrical package having terminals to be applied to said electrodes.

15. In the combination of claim 14, the feature that said connector body has additional detent means to secure it to said plate.

16. In the combination of claim 13, the feature that said connector body is adapted to be applied to one side of a printed circuit board with said first portions of said electrodes extending to the other side of said board through openings in said board, detent means on said connector body passing also through openings in said board, and said detent means holding secured to said connector body an electrical package having terminals applied to said first portion of said electrodes.

* * * * *